United States Patent
Kawano

(10) Patent No.: US 6,476,313 B2
(45) Date of Patent: Nov. 5, 2002

(54) SOLAR CELL AND METHOD FOR FABRICATING THE SAME

(75) Inventor: Kenzo Kawano, Yoshino-gun (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/861,867

(22) Filed: May 22, 2001

(65) Prior Publication Data

US 2002/0007846 A1 Jan. 24, 2002

(30) Foreign Application Priority Data

May 24, 2000 (JP) ........................ 2000-153572
May 17, 2001 (JP) ........................ 2001-148054

(51) Int. Cl.$^7$ .................. H01L 31/04; H01L 31/06
(52) U.S. Cl. .................. 136/255; 136/256; 136/261; 136/249; 438/57; 438/59; 438/98; 257/431; 257/461
(58) Field of Search ............... 136/255, 256, 136/261, 249; 438/57, 59, 98; 257/431, 461

(56) References Cited

U.S. PATENT DOCUMENTS

| | | | |
|---|---|---|---|
| 4,323,719 A | 4/1982 | Green | 136/249 |
| 4,759,803 A * | 7/1988 | Cohen | 136/244 |
| 4,935,067 A | 6/1990 | Sato et al. | 136/255 |
| 5,223,044 A | 6/1993 | Asai | 136/255 |
| 5,330,584 A * | 7/1994 | Saga et al. | 136/255 |

FOREIGN PATENT DOCUMENTS

| | | |
|---|---|---|
| DE | 38 19 671 C2 | 1/1989 |
| DE | 41 36 827 A1 | 5/1992 |
| EP | 693787 A2 * | 1/1996 |
| EP | 0 693 787 A2 | 1/1996 |
| JP | 62-106663 | 5/1987 |
| JP | 4-179169 | 6/1992 |
| JP | 4-179169 A * | 6/1992 |
| JP | 5-110121 | 4/1993 |

OTHER PUBLICATIONS

German Search Report dated May 23, 2002.

* cited by examiner

*Primary Examiner*—Alan Diamond
(74) *Attorney, Agent, or Firm*—Nixon & Vanderhye P.C.

(57) ABSTRACT

A solar cell including a semiconductor substrate of a first conductive type; a first region of a second conductive type provided on a surface of the substrate; and a bypass function region including a second region of a second conductive type provided on the surface of the substrate and spaced a predetermined distance from the first region, and a third region for setting the substrate and the second region at the same potential; wherein when a reverse voltage is applied between the substrate and the first region, the bypass function region forms a bypass circuit between the substrate and the first region using a depletion layer formed inside the substrate by the reverse voltage.

14 Claims, 7 Drawing Sheets

SOLAR CELL AND METHOD FOR FABRICATING THE SAME

CROSS-REFERENCE TO RELATED APPLICATION

This application is related to Japanese Patent Application No. 2000-153572 filed in May 24, 2000, whose priority is claimed under 35 USC §119, the disclosure of which is incorporated by reference in its entirety.

BACKGROUND OF THE INVENTION

1. Field of the Invention

The present invention relates to a solar cell and a method for fabricating the same; more specifically, it relates to a solar cell having a bypass function, which protects the solar cell from a reverse voltage applied when the solar cell is light-shielded in the solar cell module.

2. Related Art

In order to construct a photovoltaic power generation system in which a high current and high voltage is required, a conventional solar cell module has been provided which includes a plurality of serial or parallel connected solar cells to obtain the desired output current and output voltage. However, in case a solar cell in such a solar cell module is light-shielded by a shadow of something, a reverse voltage (reverse bias) generated in the other cells is applied to the light-shielded solar cell.

If the reverse voltage should exceed a reverse breakdown voltage of the cell, a breakdown occurs on the junction in the cell as to cause a large current flow, thereby resulting in a drop in power output of the entire solar cell module.

In case of solar cell modules for use in space, for instance, during the attitude control of a satellite, a part of the satellite or a structure such as an antenna, etc., may cast a shadow on the solar cell module. In case of terrestrial use, the shadow occurs due to, for instance, the neighboring buildings or the adhesion of the droppings of fowls. In order to prevent the breakdown of the solar cells due to the applied reverse voltage, there are known solar cell modules having bypass diodes externally attached to each solar cell or to each group of solar cells. Furthermore, there is also known a so-called diode integrated solar cell in which bypass diodes are integrated to the solar cells (see, for instance, Japanese Unexamined Patent Publication No. Hei 4(1992)-179169 or Japanese Unexamined Patent Publication No. Hei 5(1993)-110121).

However, in case the bypass diodes are attached externally to the solar cells, there occurred a problem of lowering the mount density of the solar cells on a substrate due to an increase in the number of mounted components, or another problem of increasing the fabrication steps of the module.

On the other hand, in case the diodes are integrated to the solar cells, the fabrication steps become so complicated because the bypass diodes are integrated together with the solar cells on the same silicon substrate, and this leads to a problem of increasing the fabrication cost.

Furthermore, the bypass diodes of the conventional type have a Zener diode structure. This structure is characterized in that the PN junction that is formed by two high density impurity diffusion layers has an acute impurity distribution. This leads to a problem of causing fluctuation in current characteristics due to a fluctuation in one or both of the diffusion layers.

SUMMARY OF THE INVENTION

In the light of the aforementioned circumstances, the present invention provides a solar cell comprising: a semiconductor substrate of a first conductive type; a first region of a second conductive type provided on a surface of the substrate; and a bypass function region including a second region of a second conductive type provided on the surface of the substrate and spaced a predetermined distance from the first region, and a third region for setting the substrate and the second region at the same potential; wherein when a reverse voltage is applied between the substrate and the first region, the bypass function region forms a bypass circuit between the substrate and the first region using a depletion layer formed inside the substrate by the reverse voltage.

DESCRIPTION OF THE PREFERRED EMBODIMENTS

Figure 1:
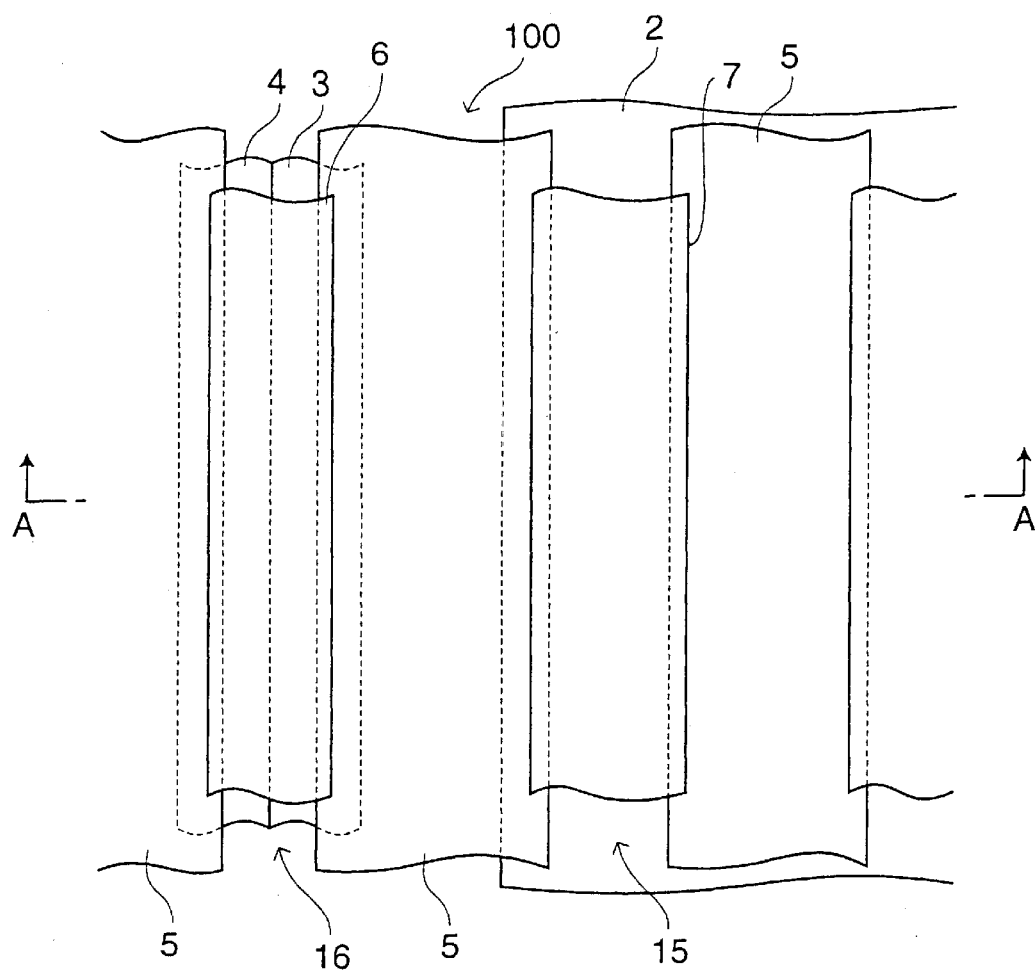
FIG. 1 is a planar view of an embodiment according to the present invention.

The first conductive type and the second conductive type as referred in the invention signifies that, in case one is of P-type, the other becomes N-type.

As the semiconductor substrate referred in the present invention, there can be used, a P-type or a N-type silicon substrate.

To set the semiconductor substrate of the first conductive type and the second region of the second conductive type at the same potential, there can be provided a short-circuit member which establishes a short circuit between them. The short-circuit member can be formed by using the same material as that of the surface electrode provided to the surface of the substrate and at the same fabrication step.

More specifically, in the present invention, the surface electrode provided to the surface of the first region of the second conductive type may further be equipped with a short-circuit member which establishes a short circuit between the semiconductor substrate of the first conductive type and the second region of the second conductive type, and the short-circuit member may be formed with the same material as that of the surface electrode.

Furthermore, the contact resistance between the short-circuit member and the substrate of the first conductive type can be reduced by providing the contact region with an impurity-diffused region of a first conductive type having a higher impurity density than that of the semiconductor substrate of the first conductive type.

More specifically, the semiconductor substrate of the first conductive type may comprise, on the surface thereof, an impurity-diffused region of a first conductive type having an impurity density higher than that of said substrate, and the short-circuit member may establish a short circuit between said substrate and the second region of the second conductive type via the region of the first conductive type. Further, the second region of the second conductive type and the impurity-diffused region of the first conductive type can be fabricated without requiring a high processing precision because they may be placed in contact with each other, or with some distance interposed between them.

Furthermore, instead of using the short-circuit member above, the junction connecting the second region of the second conductive type with the semiconductor substrate of the first conductive type may be subjected to implant treatment using charged ions or protons or to sandblast treatment of super fine particles to generate crystal defects in the junction. In this manner, a leak current can be generated at the junction to fix the substrate of the first conductive type with the region of the second conductive type at the same potential.

In other words, on the surface of the semiconductor substrate, the boundary between the substrate and the second region of the second conductive type may be provided with a region having defective crystals formed by implant treatment using charged ions or protons or by sandblast treatment using super fine particles, or, it may comprise a region of a first conductive type having an impurity density higher than that of said substrate, and a region having defective crystals at the boundary between the second region of the second conductive type and the region of the first conductive type, provided that the defects are formed by implant treatment using charged ions or protons or by sandblast treatment using super fine particles.

In the solar cell of the present invention, the photoreceptive surface is preferably formed in an antireflective shape. In this manner, the photoreceptive surface can be increased in effective area. The term "antireflective shape" refers to such a morphology capable of diffusing the light; for instance, it refers to an irregular surface having a saw tooth-like cross section.

Further, the first and second regions of the second conductive type may have edges adjacent to each other, the edges having a comb-like shape to extend an adjacent length. In this manner, the effective length for suppressing the reverse bias current flow is increased.

Further, the bypass function region may continuously surround the periphery of the solar cell. In this manner, the effective photoreceptor region can be increased.

Further, the bypass function region may be provided in a plurality of regions. By doing so, bypass function works at many points and the distance between the parts of shadows and the bypass function region becomes shorter.

The present invention provides, from a different point of view, a method for fabricating a solar cell, comprising the steps of: forming a region of a first conductive type on a part of a surface of a semiconductor substrate of a first conductive type; forming a first region of a second conductive type on another part of the surface;

forming, on the surface of the substrate, a second region of the second conductive type adjacent to the region of the first conductive type and spaced a predetermined distance from the first region; and forming a region for electrically connecting the region of the first conductive type with the second region.

In the above case, preferably, an oxide film is used as a mask in forming the first and the second regions of the second conductive type on the surface of the substrate, such that the second region of the second conductive type may not be exposed at the edge portion of the cell (cell edge). In this manner, the leak current at the cell edge can be prevented from generating. Furthermore, the oxide film may be formed by a CVD process.

The present invention is described in further detail by way of non-limiting examples shown and by making reference to the drawings.

Figure 2:
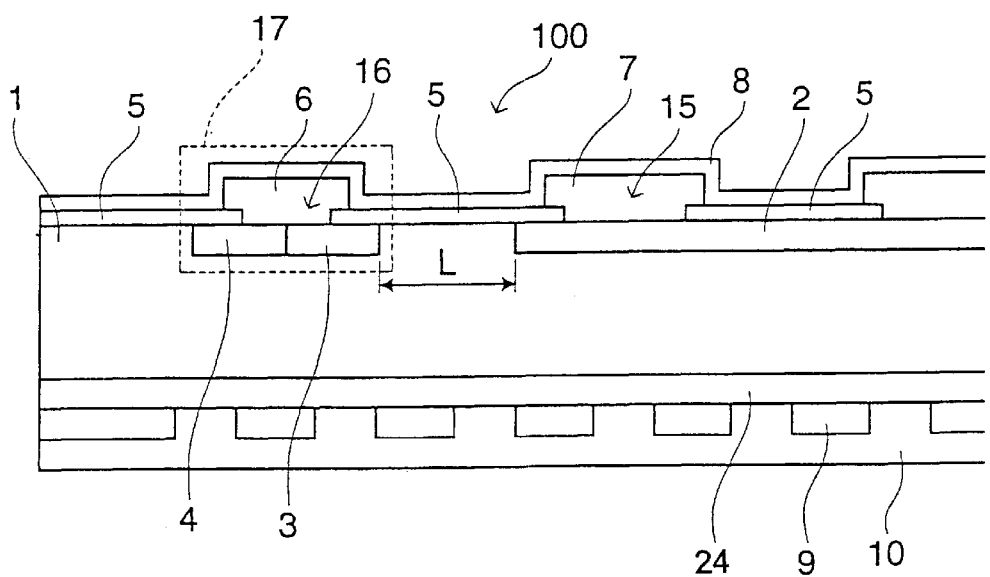
FIG. 2 is a cross section view seen along line A—A of FIG. 1.

FIG. 1 is a planar view showing the main portion of an embodiment according to the present invention, and FIG. 2 is a cross section view seen along line A—A shown in FIG. 1.

Referring to the above figures, a solar cell 100 equipped with a bypass function includes a photoreceptive portion of the solar cell provided by forming a first N-type impurity-diffused region 2 on a P-type silicon substrate 1, and a second N-type impurity-diffused region 3, whose potential is fixed to the same value as that of the P-type silicon substrate 1, being formed at a predetermined distance L from the photoreceptive portion, i.e., the region 2.

That is, on the photoreceptive surface of the P-type silicon substrate 1 are provided the N-type impurity-diffused regions 2 and 3 set apart from each other at a distance L. A P-type impurity-diffused regions 4 is provided adjacent to the N-type impurity-diffused region 3. thermally oxidized film 5 is further formed thereon.

Contact apertures 15 and 16 are formed in the thermally oxidized film 5. In a bypass function region 17 the N-type impurity-diffused region 3 and the P-type impurity-diffused region 4 are connected with a conductive element 6 through the contact aperture 16. A N-side electrode 7 for power output connected to the N-type impurity-diffused region 2 is provided via the contact aperture 15, and an antireflection coating 8 is laminated thereon. The antireflection coating 8 is not shown in FIG. 1, but reference can be made to FIG. 2.

On the other hand, a P-type impurity-diffused region 24 is formed on the rear surface of the P-type silicon substrate 1, and a CVD film 9 and a P-side electrode 10 for power output are further provided thereon.

In case a part of the solar cell module constructed from the cells of the structure described above is shaded in use, a reverse bias voltage Vr is applied to a shaded cell so that a positive polarity is applied to the N-type impurity-diffused region 2 and a negative polarity is applied to the P-type silicon substrate 1.

Figure 3:
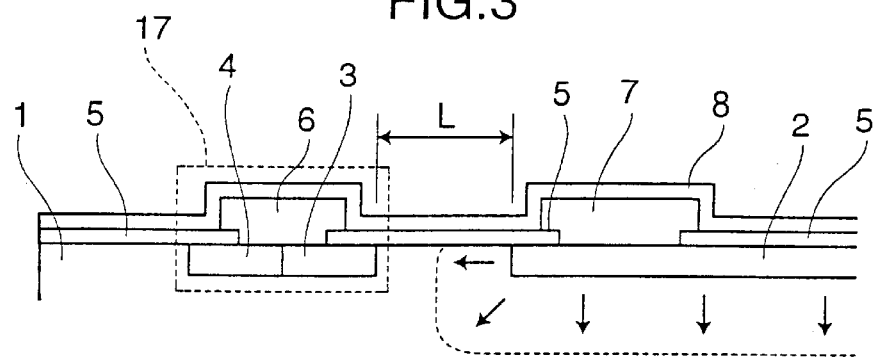
FIG. 3 is an explanatory diagram showing the bypass function of an example according to the present invention.

In this instance, a depletion layer is formed at the PN junction in accordance with the applied reverse bias. The density of the doped impurities of the P-type silicon substrate 1 is about $10^{16}$ cm$^{-3}$, and the N-type impurity density is about $10^{19}$ cm$^{-3}$. These densities are used for a conventional solar cell. Thus, the formed depletion layer is mostly extended inside the P-type silicon substrate 1 as shown by an arrow in FIG. 3.

Figure 4:
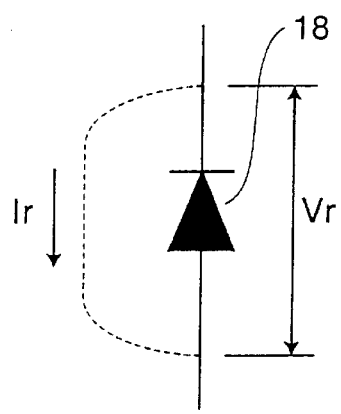
FIG. 4 is a diagram showing an equivalent circuit of the main portion of an example according to the present invention.

Furthermore, in case the depletion layer reaches the N-type impurity-diffused region 3 whose potential is fixed to the same value as that of the P-type silicon substrate 1, a potential difference between the N-type impurity-diffused regions 2 and 3 becomes Vr. Hence, a punch through current flows between the regions 2 and 3. FIG. 4 shows an equivalent circuit for this case, and a current path is formed as shown by a broken line on the PN junction 18. Thus, the flow of a reverse current Ir can suppress an increase in the potential difference Vr as shown in the Vr-Ir characteristics of FIG. 5. In this manner, the breakdown of the PN junction of the solar cell can be prevented from occurring.

Figure 5:
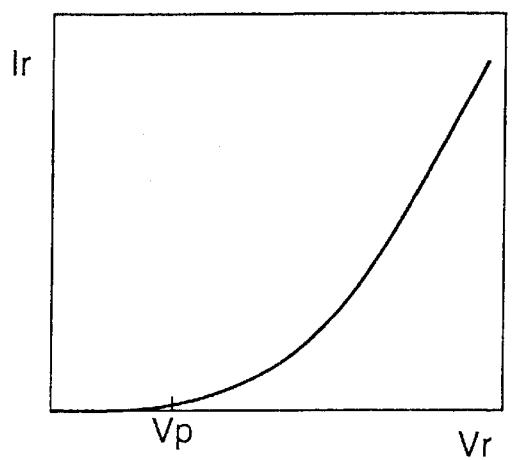
FIG. 5 is a diagram showing the Vr-Ir characteristics of an example according to the present invention.

Referring to FIG. 5, the flow of current Ir initiates at a voltage Vp, and this voltage depends on the distance L between the first and the second N-type impurity-diffused regions 2 and 3. Thus, the voltage Vp can be set as desired.

Figure 6:
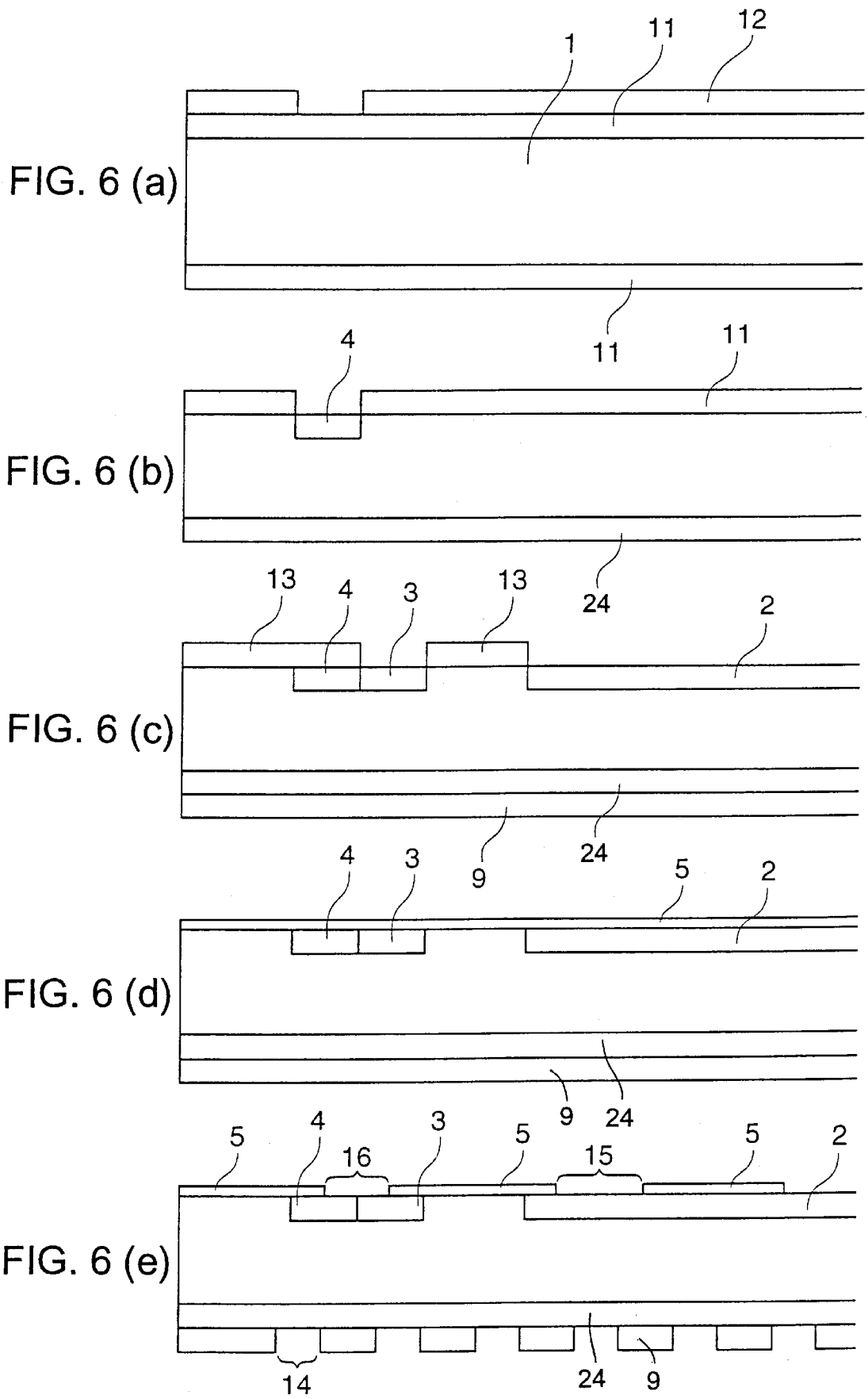
FIGS. 6(a)–6(e) are diagrams showing the process of a fabrication method according to the present invention.

Then, referring to FIG. 6, the process for fabricating the solar cell having the above structure will be described below.

Referring to FIG. 6(a), a thermally oxidized film 11 is formed at a thickness of, for instance, 200 to 400 nm, on the both sides of a P-type silicon substrate 1 of a desired thickness. Then, in order to form a P-type impurity-diffused region 4 shown in FIG. 1 on one of the sides, which later serves as a photoreceptive surface, a photoresist 12 is selectively patterned by means of a known photolithography.

Then, referring to FIG. 6(b), the surface oxide film 11 is selectively removed by using the photoresist 12 patterned in the previous step as a mask. In this instance, the oxide film 11 formed on the back plane is also removed.

By using $BBr_3$ and the like, P-type impurity-diffused regions 4 and 24 with a density of about $1 \times 10^{20}$ $cm^{-3}$ is formed thereafter, and the oxide film 11 is removed upon completion.

Referring to FIG. 6(c), oxide films 9 and 13 are formed on the both sides of the substrate, each at a thickness of about 400 nm, by means of CVD process. Then, to form N-type impurity-diffused regions 2 and 3 (see FIG. 2), a part of the oxide film 13 is removed by means of a known photolithography or etching technique.

Then, the N-type impurity-diffused regions 2 and 3 with a density of about $1 \times 10^{19}$ $cm^{-3}$ are formed by using $POCl_3$ and the like. At the same time, the oxide film 13 prevents N-type impurities from being diffused to the cell edge regions, thereby preventing the PN junction from being exposed at the cell edge. Thus, a planar structure for suppressing a leak current at the peripheral portions of the cell is established. Then, the remaining oxide film 13 is removed.

Referring then to FIG. 6(d), a thin thermally oxidized film 5 (about 20 nm in thickness) is formed to stabilize the surface.

Then, referring to FIG. 6(e), a contact aperture 14 is formed on the oxide film 9 provided to the rear side, to establish an electric connection between the P-type impurity-diffused region 4 and the P-side electrode 10 (see FIG. 2). Further, a contact aperture 15 is formed on the thermally oxidized film 5 provided to the front surface, to establish an electric connection between the N-type impurity-diffused region 2 and the N-side electrode 7 (see FIG. 2). In addition, a contact aperture 16 is formed on the thermally oxidized film 5 provided to the surface to fix the potential of the N-type impurity-diffused region 3 and the P-type impurity-diffused region 4 at the same level by the conductive element 6 (see FIG. 2).

Referring to FIG. 2, known technique is employed to form the N-side electrode 7 and the P-side electrode 10, and the conductive element 6 by using the same material in a single process step. Then, an antireflection coating 8 is formed on the photoreceptive side to obtain the final structure of a solar cell having integrated punch-through type bypass function devices provided thereto as shown in FIG. 2.

Figure 7:
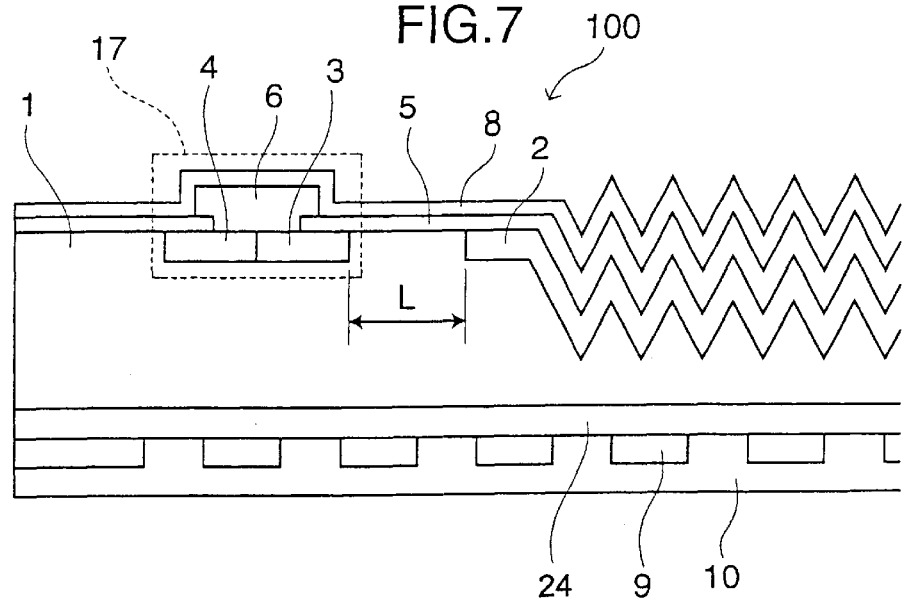
FIG. 7 is a diagram corresponding to FIG. 2 above for another embodiment according to the present invention.

Further, referring to FIG. 7, the photoreceptive surface may be provided in an antireflective morphology with a saw tooth-like cross section, while keeping the bypass function region 17 flat. In this manner, a sufficient absorption of light can be expected at the photovoltaic conversion portion, and yet, a sufficient bypass function can be provided to the resulting solar cell.

Figure 8:
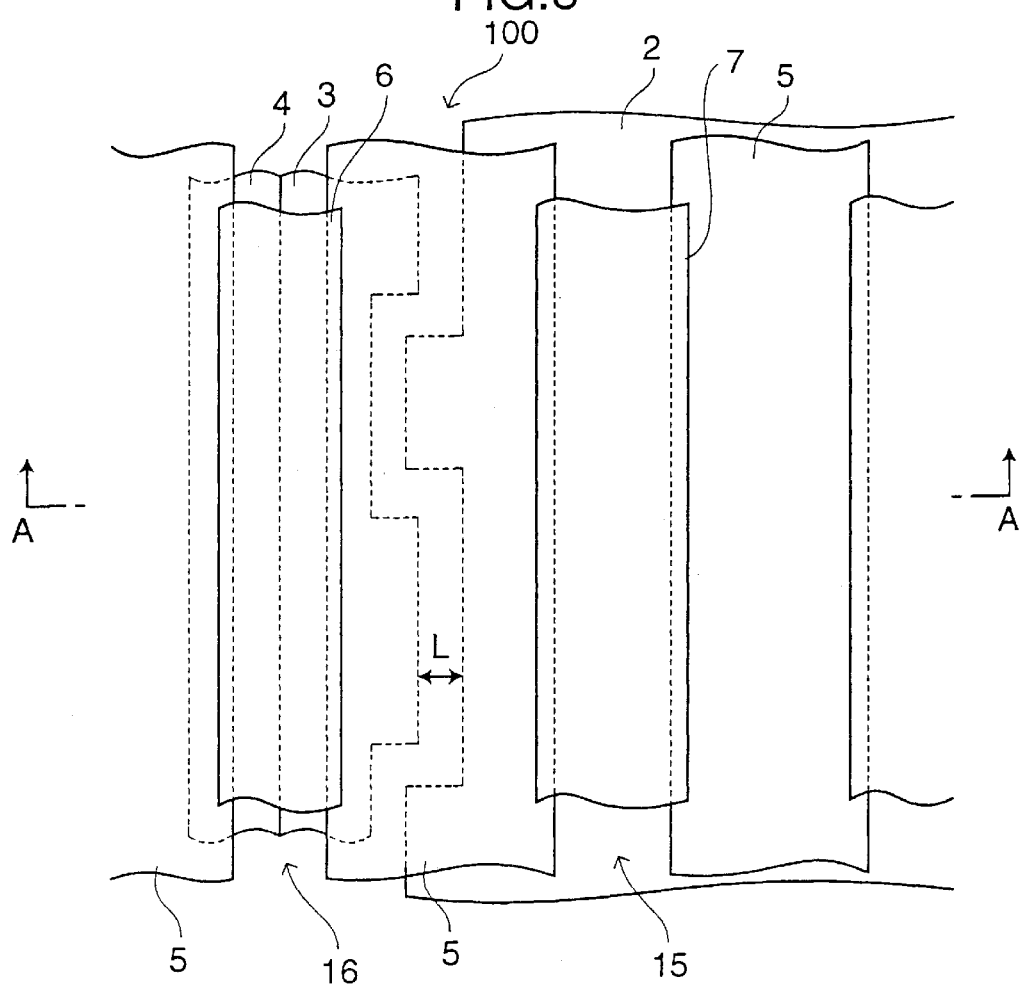
FIG. 8 is a diagram corresponding to FIG. 1 above for a still other embodiment according to the present invention.

Otherwise, referring to FIG. 8, the N-type diffusion regions 2 and 3 may be formed in an interleaved comb-like morphology. In this manner, the effective length of the portion for flowing the reverse bias current can be increased to effectively suppress the increase in Vr.

Figure 9:
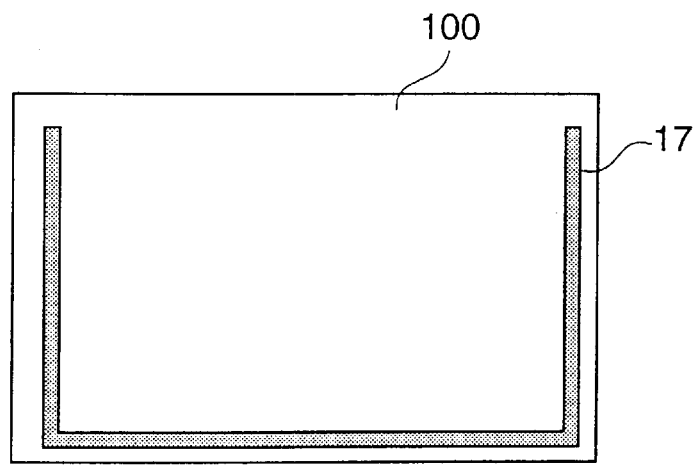
FIG. 9 is a diagram showing the planar view of a cell layout according to the present invention.

Furthermore, referring to FIG. 9, the bypass function region 17 may be formed in the peripheral portion of the solar cell 100. In this manner, the region for receiving light other than the bypass function region 17 can be increased to elevate the output power of the solar cell.

Figure 10:
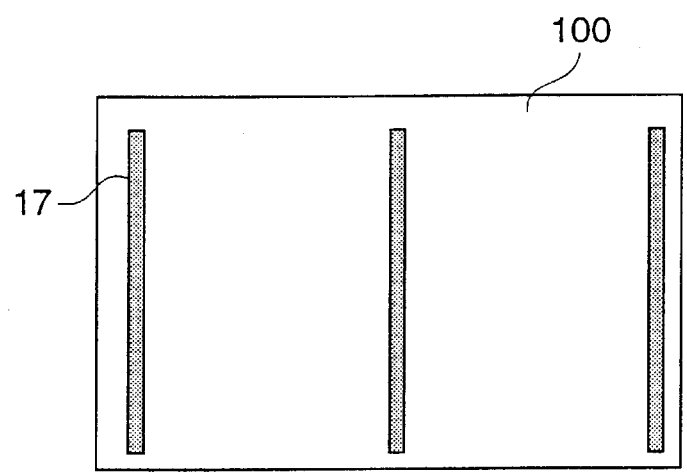
FIG. 10 is a diagram showing the planar view of another cell layout according to the present invention.

Referring to FIG. 10, furthermore, the bypass function region 17 can be divided into several discontinued regions at the desired sites. In this manner, the bypass function can be implemented at a plurality of points. This shortens the distance from the shaded portion to the bypass function region 17 to effectively prevent junction breakdown from occurring.

Figure 11:
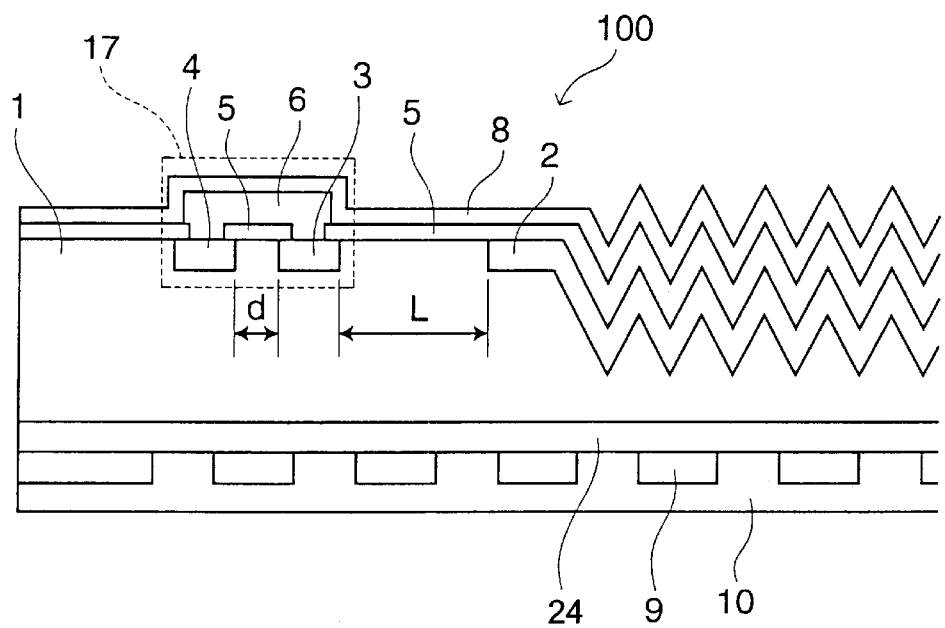
FIG. 11 is a diagram corresponding to FIG. 7 above for a yet other embodiment according to the present invention.

FIG. 11 shows another embodiment according to the present invention, and is a diagram corresponding to that of FIG. 7. In this embodiment, a N-type impurity-diffused region 3 and a P-type impurity-diffused region 4 in the bypass function region 17 are formed on the surface of a P-type silicon substrate 1 so that they are separated from each other at a distance d. A thermally oxidized film 5 is left over at the portion corresponding to the interval d, and the regions 3 and 4 are connected with each other by a conductive element 6. The other constitutions except for the bypass function region 17 are the same as those shown in FIG. 7.

Figure 12:
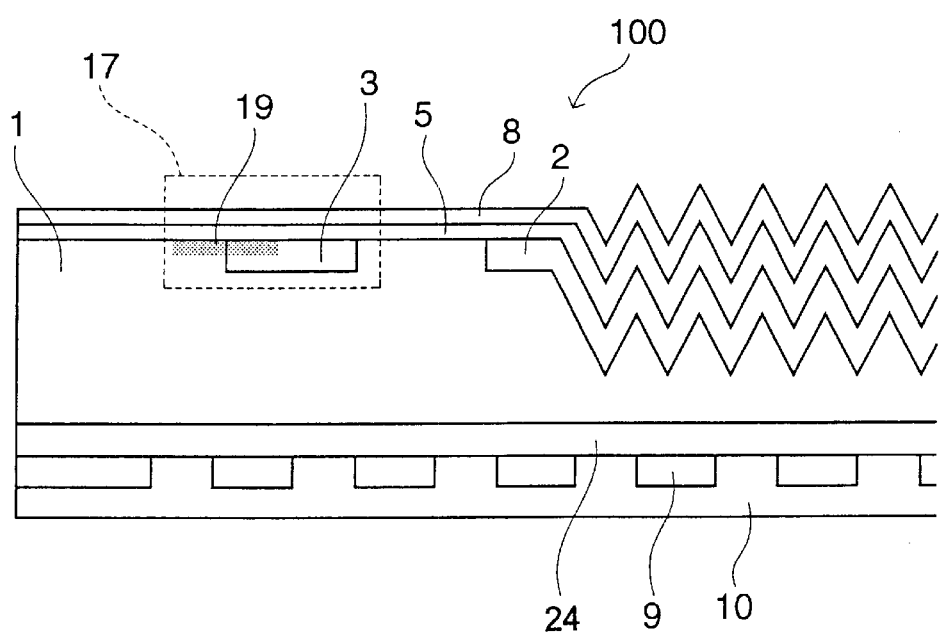
FIG. 12 is a diagram corresponding to FIG. 7 above for a still other embodiment according to the present invention.

FIG. 12 shows a yet other embodiment according to the present invention, and is a diagram corresponding to that of FIG. 7. In this embodiment, instead of providing the P-type impurity-diffused region 4 and the conductive element 6 shown in FIG. 7, a defective crystal region 19 is formed at the junction between the P-type silicon substrate 1 and the N-type impurity-diffused region 3 by implant treatment using charged ions or protons or by sandblast treatment using super fine particles on the front surface of the substrate 1. In this manner, a bypass function region 17 is formed, and the other constitutions are similar to those shown in FIG. 7. In the embodiment shown in FIG. 12, the defective crystal region 19 generates a junction leak current, and hence the P-type silicon substrate 1 and the N-type impurity-diffused region 3 can be set at the same potential.

Figure 13:
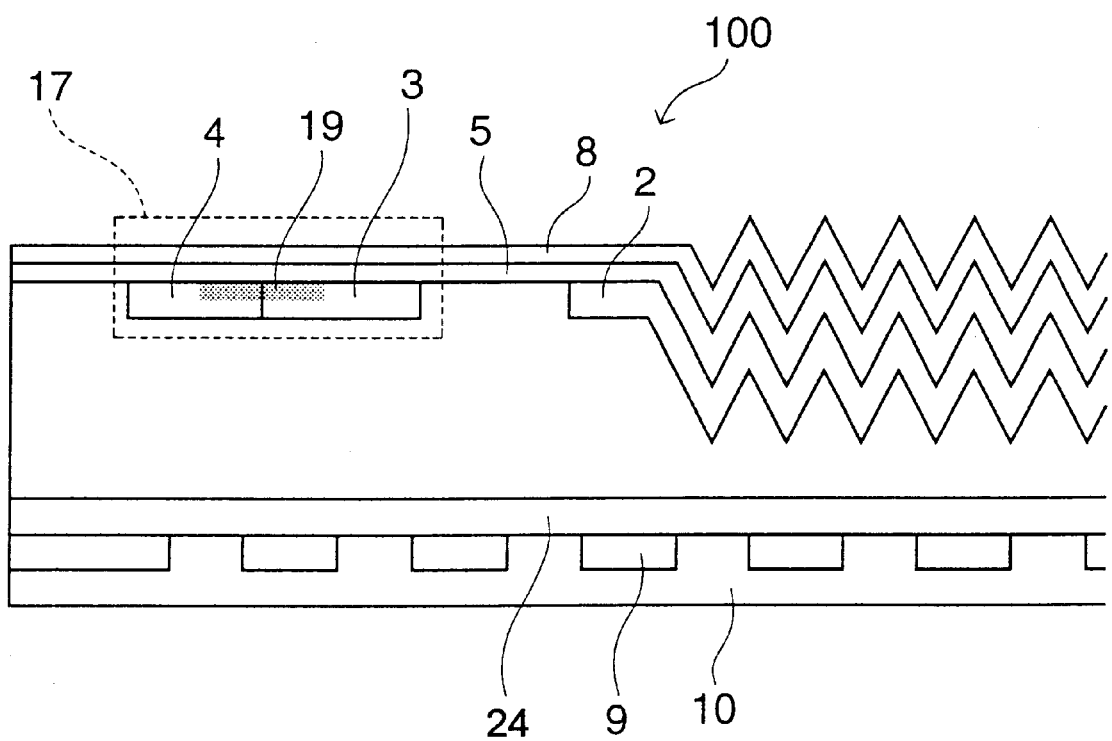
FIG. 13 is a diagram corresponding to FIG. 7 above for a still yet other embodiment according to the present invention.

FIG. 13 shows a still other embodiment according to the present invention, and is a diagram corresponding to that of FIG. 7. In this embodiment, instead of providing the conductive element 6 of FIG. 7, a defective crystal region 19 is formed at the junction between the N-type impurity-diffused region 3 and the P-type impurity-diffused region 4 in a manner similar to that described with reference to FIG. 12.

Thus, except for the bypass function region 17 the other constitutions are equivalent to those shown in FIG. 7. In this embodiment again, the defective crystal region 19 generates a junction leak current such that the P-type silicon substrate 1 and the N-type impurity-diffused region 3 are set at the same potential.

As described above, the present invention easily provides an internal bypass function region in the cell, and thereby effectively protects the solar cells from the reverse bias which generates inside the solar cell module.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A solar cell comprising:
   a semiconductor substrate of a first conductive type;
   a first region of a second conductive type provided on a surface of the substrate; and
   a bypass function region including a second region of the second conductive type provided on the surface of the substrate and spaced from the first region so that the first and second regions of the second conductive type do not contact one another, and a third region for setting the substrate and the second region at the same potential;
   wherein when a reverse voltage is applied between the substrate and the first region, the bypass function region forms a bypass circuit between the substrate and the first region using a depletion layer formed inside the substrate by the reverse voltage so that a punch through current flows through the depletion layer between the first and second regions of the second conductive type.

2. The solar cell of claim 1, wherein the surface of the substrate having the first region acts as a photoreceptive surface.

3. The solar cell of claim 2, wherein the surface of the substrate having the first region is formed in an antireflective shape.

4. The solar cell of claim 1, wherein the first and the second regions have edges adjacent to each other, the edges having a comb shape to extend an adjacent length.

5. The solar cell of claim 1, wherein the bypass function region continuously surrounds the periphery of the solar cell.

6. The solar cell of claim 1, wherein the bypass function region is separately provided in a plurality of regions of the solar cell.

7. The solar cell of claim 1 further comprising a surface electrode on the first region, the third region including a short-circuit member for establishing a short circuit between the semiconductor substrate and the second region, the surface electrode and the short-circuit member being made of the same material.

8. The solar cell of claim 1, wherein the bypass function region comprises a fourth region of the first conductive type having an impurity density higher than that of the substrate, and wherein the third region comprises a short-circuit member for establishing a short circuit between the substrate and the second region through the forth region.

9. The solar cell of claim 1, wherein the third region comprises a region having defective crystals across a boundary between the substrate and the second region and that is formed by implant treatment using charged ions or protons or by sandblast treatment using super fine particles.

10. The solar cell of claim 1, wherein the bypass function region comprises a fourth region of the first conductive type adjacent to the second region and having an impurity density higher than that of the substrate, and the third region comprises a fifth region having defective crystals across a boundary between the second region and the fourth region, the fifth region being formed by spraying superfine particles.

11. A method for fabricating the solar cell of claim 1, comprising the steps of:
    forming a region of a first conductive type on a part of a surface of the semiconductor substrate of the first conductive type;
    forming a first region of a second conductive type on another part of the surface;
    forming, on the surface of the substrate, a second region of the second conductive type adjacent to the region of the first conductive type and spaced a distance from the first region; and
    forming a region for electrically connecting the region of the first conductive type with the second region.

12. The method of claim 11, wherein, in the step of forming the second region on the surface of the substrate, an oxide film is used as a mask for preventing the second region from being exposed at a cell edge.

13. The method of claim 12, wherein, the oxide film is formed by a CVD process.

14. A solar cell comprising:
    a semiconductor substrate of a first conductive type;
    a first region of a second conductive type provided on a surface of the substrate at least partially in a photoreceptive portion of the solar cell;
    bypass means for performing a bypass function, the bypass means including a second region of the second conductive type provided on the surface of the substrate and spaced from the first region so that the first and second regions of the second conductive type do not contact one another; and
    the bypass means further setting the substrate and the second region at the same potential so that when a reverse voltage is applied between the substrate and the first region, the bypass means forms a bypass circuit between the substrate and the first region using a depletion layer formed inside the substrate by the reverse voltage so that a punch through current flows through the depletion layer between the first and second regions of the second conductive type.

* * * * *